(12) United States Patent
Rahim et al.

(10) Patent No.: US 8,643,108 B2
(45) Date of Patent: Feb. 4, 2014

(54) BUFFERED FINFET DEVICE

(75) Inventors: Irfan Rahim, Milpitas, CA (US);
Jeffrey T. Watt, Palo Alto, CA (US);
Yanzhong Xu, Santa Clara, CA (US);
Lin-Shih Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 143 days.

(21) Appl. No.: 13/214,102

(22) Filed: Aug. 19, 2011

(65) Prior Publication Data

US 2013/0043536 A1 Feb. 21, 2013

(51) Int. Cl.
*H01L 27/12* (2006.01)
*H01L 21/336* (2006.01)

(52) U.S. Cl.
USPC ............. 257/347; 257/E27.112; 257/E21.41; 438/156

(58) Field of Classification Search
USPC ............. 257/347, E27.112, E21.41; 438/156
See application file for complete search history.

(56) References Cited

U.S. PATENT DOCUMENTS

| | | | |
|---|---|---|---|
| 6,307,233 B1 | 10/2001 | Awaka et al. | |
| 6,858,478 B2 | 2/2005 | Chau et al. | |
| 2004/0178451 A1 | 9/2004 | Yagishita et al. | |
| 2004/0256647 A1 | 12/2004 | Lee et al. | |
| 2005/0101069 A1 | 5/2005 | Mathew et al. | |
| 2005/0170593 A1* | 8/2005 | Kang et al. | 438/296 |
| 2006/0088967 A1 | 4/2006 | Hsiao et al. | |
| 2007/0247906 A1 | 10/2007 | Watanabe et al. | |
| 2007/0257296 A1 | 11/2007 | Miyano | |
| 2008/0042219 A1 | 2/2008 | Booth, Jr. et al. | |
| 2008/0128796 A1* | 6/2008 | Zhu et al. | 257/328 |
| 2008/0149984 A1 | 6/2008 | Chang et al. | |
| 2011/0074498 A1 | 3/2011 | Thompson et al. | |
| 2011/0171795 A1 | 7/2011 | Tsai et al. | |

FOREIGN PATENT DOCUMENTS

WO WO2008036047 A1 3/2008

OTHER PUBLICATIONS

European Search Report for European Patent Application No. 12 180 591.5, Dec. 12, 2012, 8 sheets.

* cited by examiner

*Primary Examiner* — Whitney T Moore
(74) *Attorney, Agent, or Firm* — Okamoto & Benedicto LLP

(57) ABSTRACT

One embodiment relates to a buffered transistor device. The device includes a buffered vertical fin-shaped structure formed in a semiconductor substrate. The vertical fin-shaped structure includes at least an upper semiconductor layer, a buffer region, and at least part of a well region. The buffer region has a first doping polarity, and the well region has a second doping polarity which is opposite to the first doping polarity. At least one p-n junction that at least partially covers a horizontal cross section of the vertical fin-shaped structure is formed between the buffer and well regions. Other embodiments, aspects, and features are also disclosed.

19 Claims, 11 Drawing Sheets

US 8,643,108 B2

BUFFERED FINFET DEVICE

BACKGROUND

1. Technical Field

The present invention relates generally to integrated circuit devices.

2. Description of the Background Art

FinFET (fin field effect transistor) devices are non-planar transistor devices which have been developed relatively recently. FinFET devices are generally characterized by a vertical fin-shaped channel and are typically formed on silicon-on-insulator (SOI) or bulk silicon substrates.

It is highly desirable to improve the robustness of finFET devices.

SUMMARY

One embodiment relates to a buffered transistor device. The device includes a buffered vertical fin-shaped structure formed in a semiconductor substrate. The vertical fin-shaped structure includes at least an upper semiconductor layer, a buffer region, and at least part of a well region. The buffer region has a first doping polarity, and the well region has a second doping polarity which is opposite to the first doping polarity. At least one p-n junction that at least partially covers a horizontal cross section of the vertical fin-shaped structure is formed between the buffer and well regions.

Other embodiments, aspects and features are also disclosed.

Note that the figures provided herewith are not necessarily to scale. They are provided for purposes of illustration to ease in the understanding of the presently-disclosed invention.

DETAILED DESCRIPTION

Applicants have determined that the extremely small dimensions of finFET devices in memory cells make the cells susceptible to single event upsets (SEUs) and electronic noise signals. SEUs may be caused by radiation causing the generation of electron-hole pairs at a sensitive node within a cell. The operation and performance of an integrated circuit may be substantially compromised by such SEUs. For example, field programmable gate arrays (FPGAs) and other programmable logic devices (PLDs) may be particularly sensitive to SEUs occurring in configuration random access memory (CRAM) cells. Other types of integrated circuits, such as microprocessors and application specific integrated circuits (ASICS), may also be sensitive to SEUs.

In addition, finFET devices are also susceptible to electronic noise signals which may be transmitted by way of conductive paths from other parts of an integrated circuit In particular, substrate noise may adversely impact the performance of a finFET device used in an analog circuit application.

The present disclosure provides a buffered finFET device and method of fabricating the device. In one example application, the buffered finFET device may be utilized in static memory cells so as to substantially reduce the occurrence of SEUs in the memory cells. For instance, the buffered finFET devices may be employed in CRAM cells in FPGAs or other integrated circuits. The noise resistant feature of the buffered finFET device also makes it less susceptible to substrate noise and hence well-suited for analog circuit applications.

Figure 1:
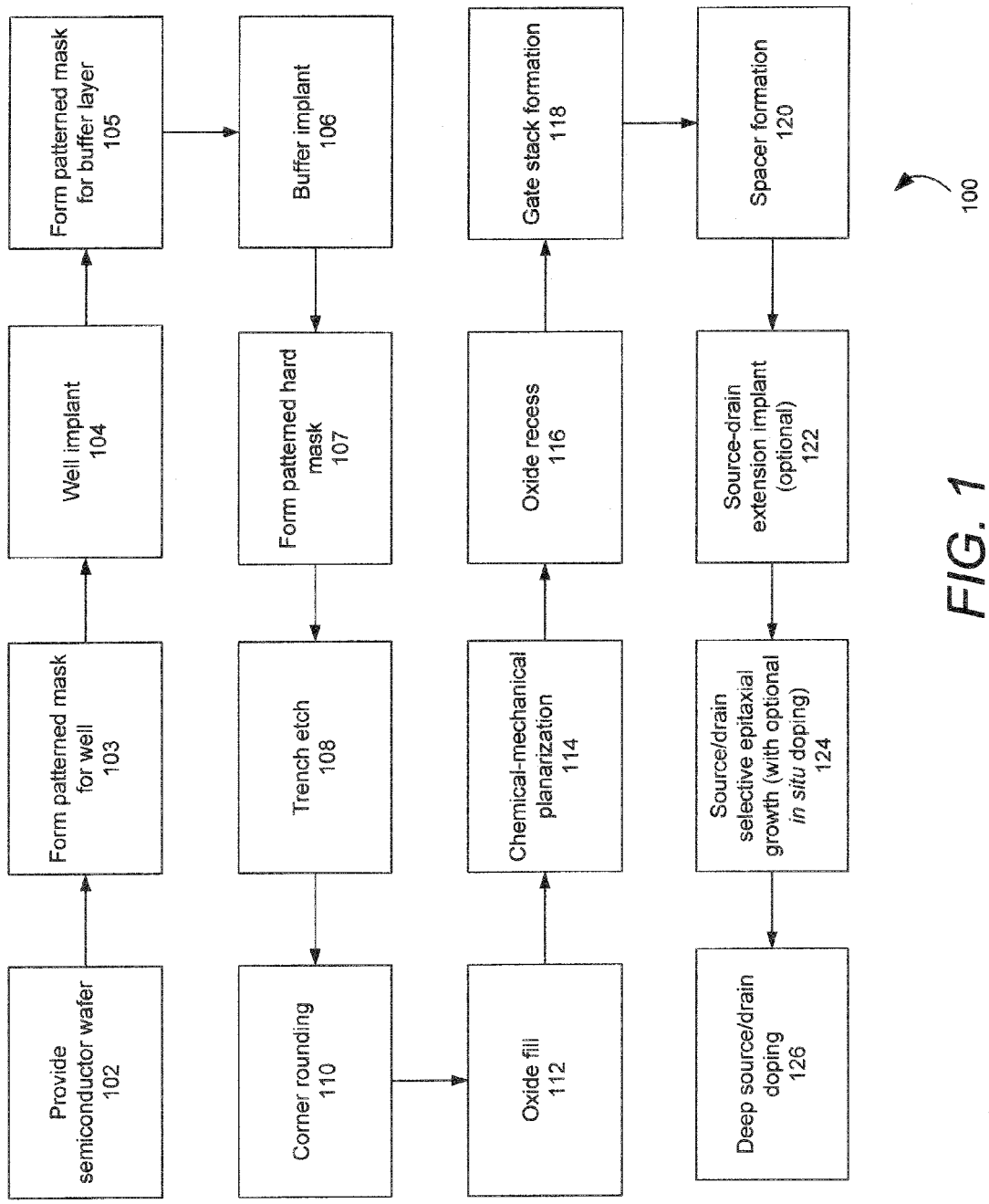
FIG. 1 is a flow chart of a method of fabricating a buffered finFET device in accordance with an embodiment of the invention.

FIG. 1 is a flow chart of a method 100 of fabricating a buffered finFET device in accordance with an embodiment of the invention. The fabrication method 100 is described below in conjunction with the structural diagrams in FIGS. 2 through 6.

Figure 2:
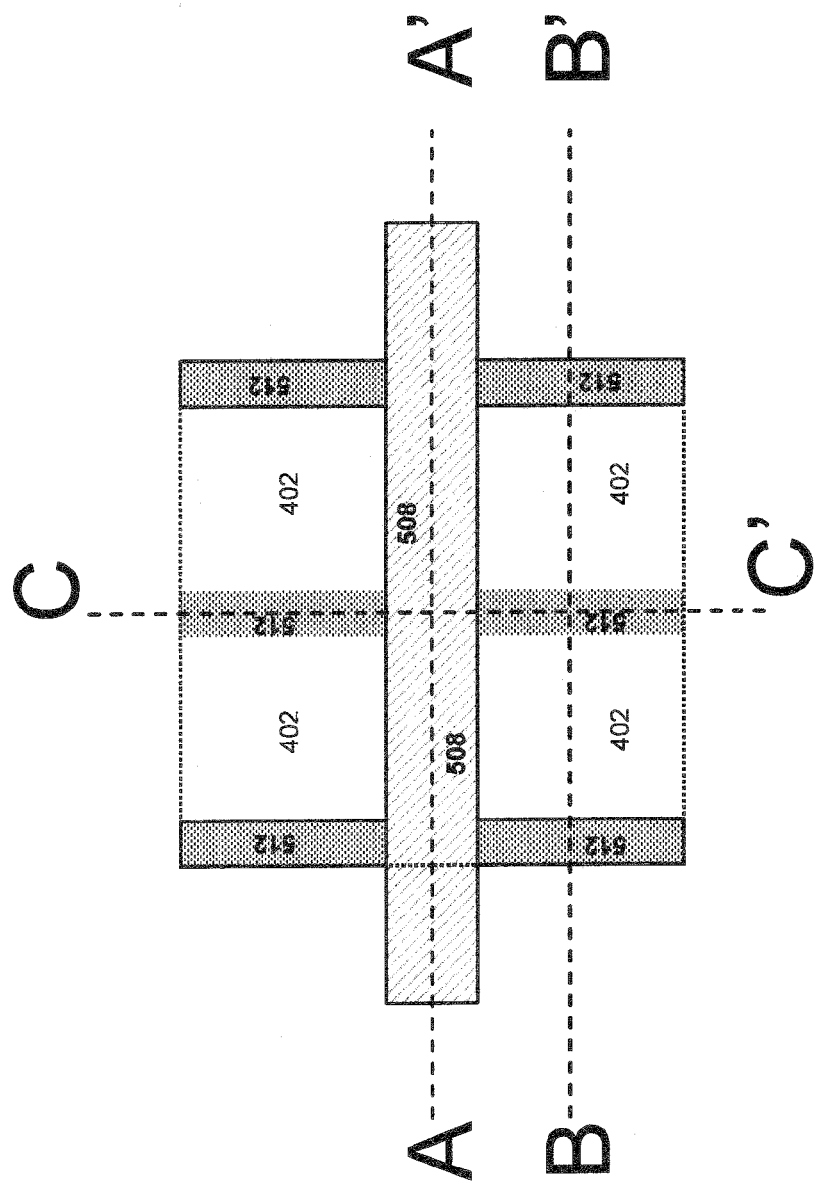
FIG. 2 is a planar view showing select features of a buffered finFET device in accordance with an embodiment of the invention.

A top (plan) view showing select features and three cross-sectional planes of the buffered finFET device is given in FIG. 2. Note that a primary purpose of FIG. 2 is to show the locations of the three cross-sectional planes which are used in the cross-sectional drawings of FIGS. 3-6 and 9. The features depicted in FIG. 2 are actually buried beneath other layers in the final finFET device. The first cross-sectional plane in FIG. 2 is labeled A-A' and cuts across the three fins under the gate electrode 508. In other words, the electrical current flowing through the fins when the transistor is on would flow through the A-A' plane. The second cross-sectional plane is labeled B-B' and is parallel to A-A'. The B-B' plane cuts across three drain (or source) features 512. The third cross-sectional plane is labeled C-C' and is perpendicular to A-A' and B-B'. The C-C' plane cuts lengthwise though a fin.

Figure 4:
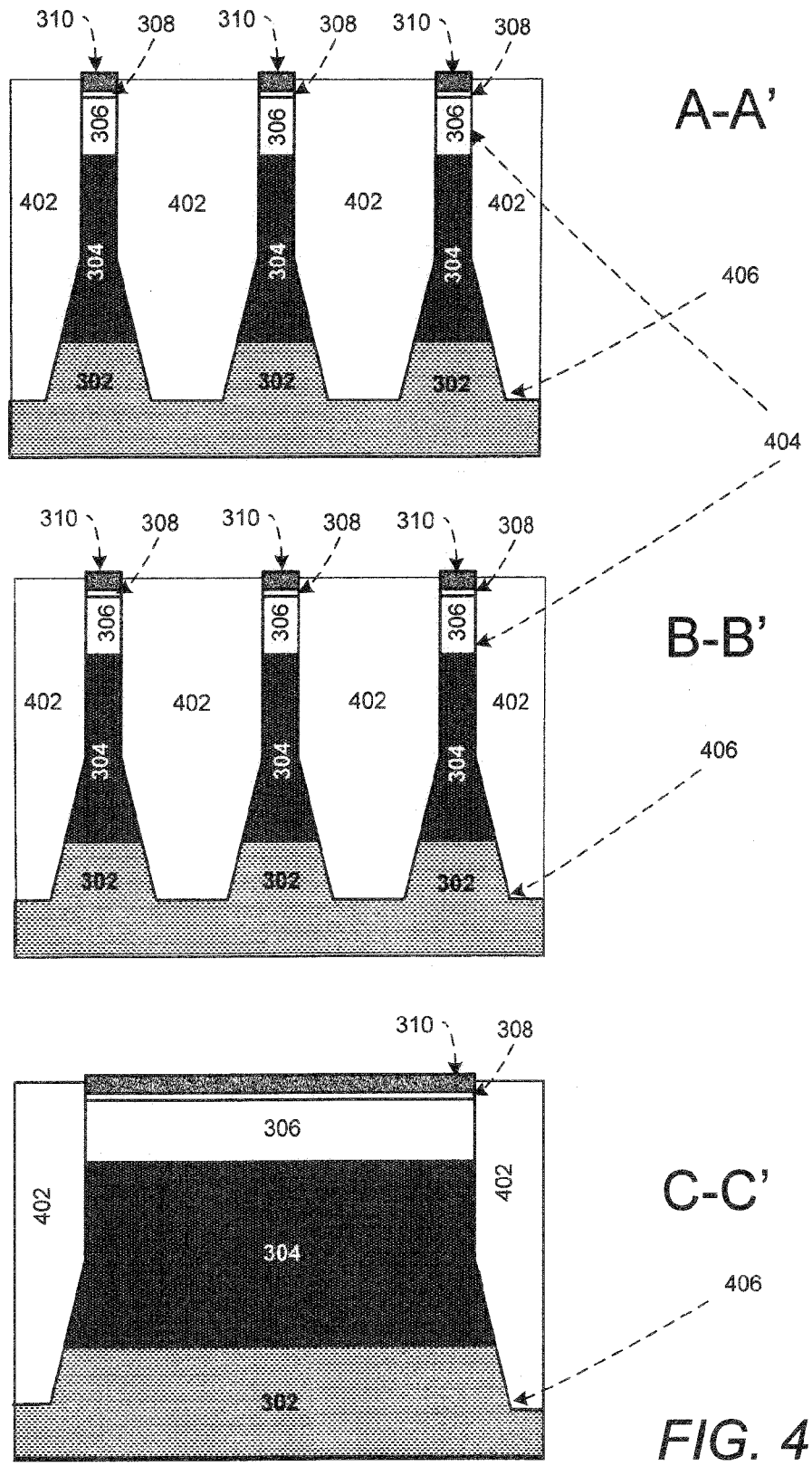
FIG. 4 shows three cross-sectional views of the first device structure after an oxide fill and chemical-mechanical planarization in accordance with an embodiment of the invention.
Figure 5:
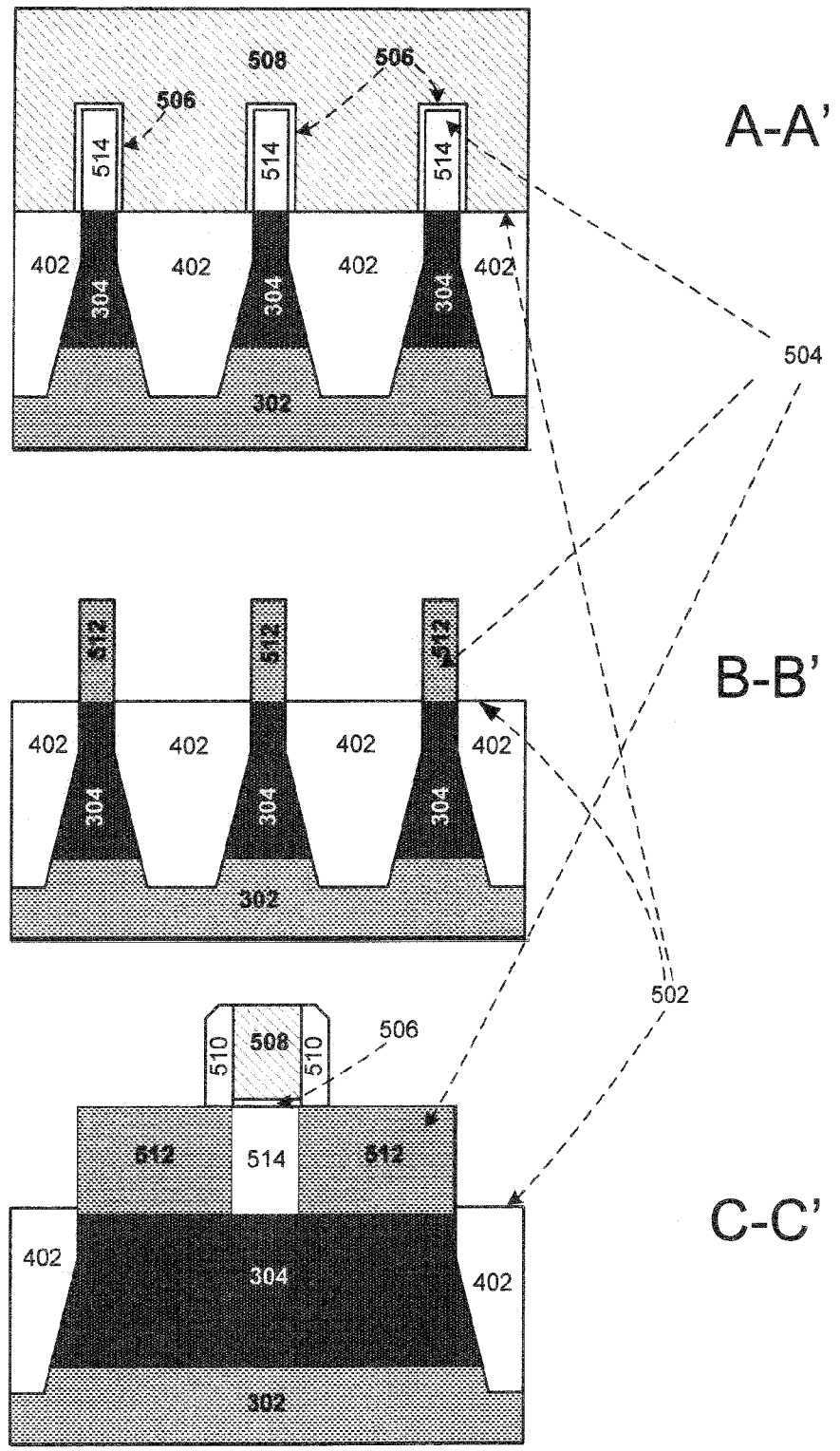
FIG. 5 shows three cross-sectional views of the first device structure after source-drain extension implantation in accordance with an embodiment of the invention.
Figure 6:
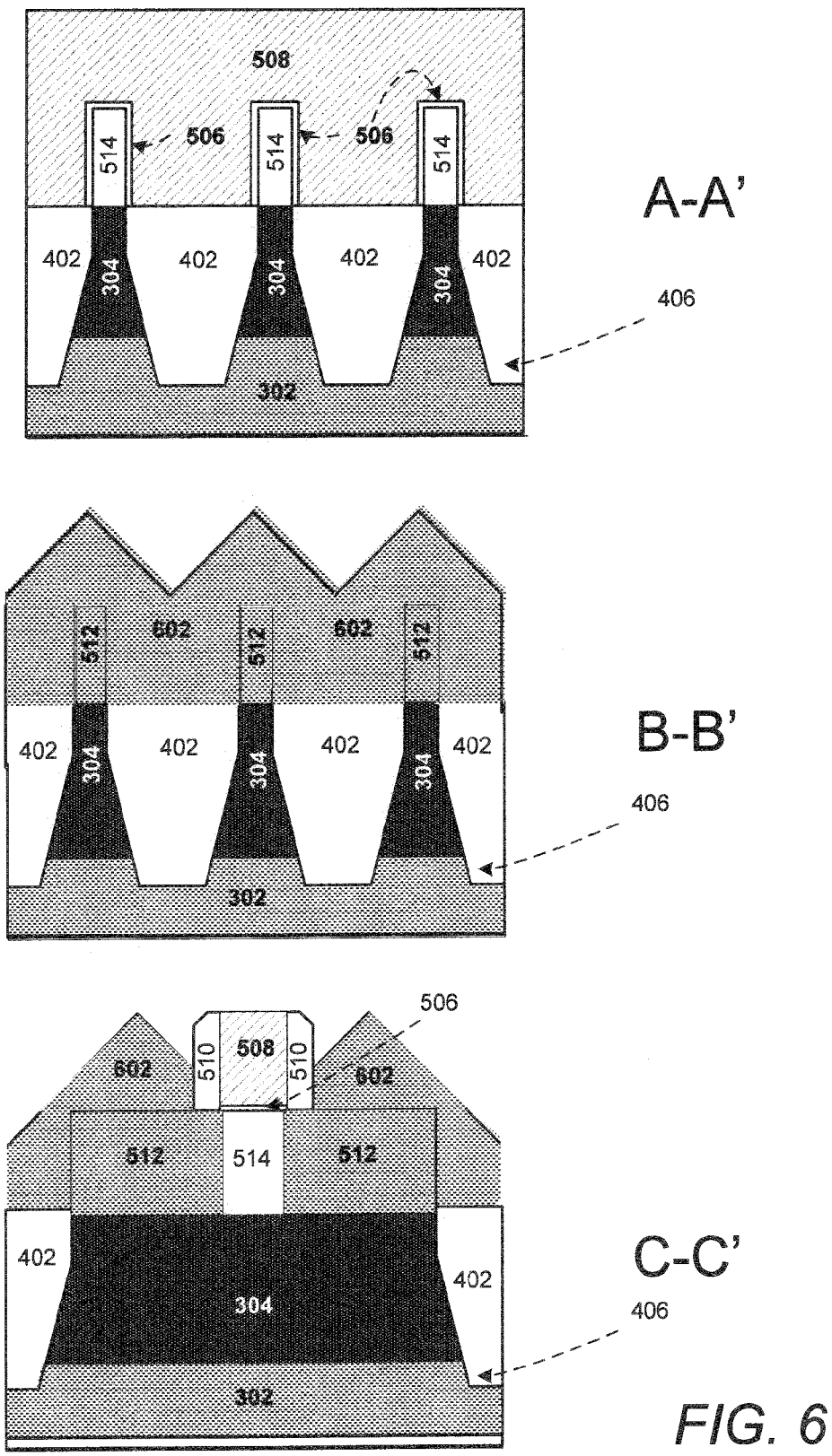
FIG. 6 shows three cross-sectional views of the first device structure after the fabrication process in accordance with an embodiment of the invention.

FIGS. 3 through 6 depict cross-sectional views of a first device structure along the three cross-sectional planes (A-A', B-B', and C-C') at various points in the fabrication process in accordance with an embodiment of the invention. The fabricated device shown in FIG. 6 provides one p-n junction for radiation hardening (and noise isolation) between the channel and the base of the vertical fin-shaped structure.

Figure 9:
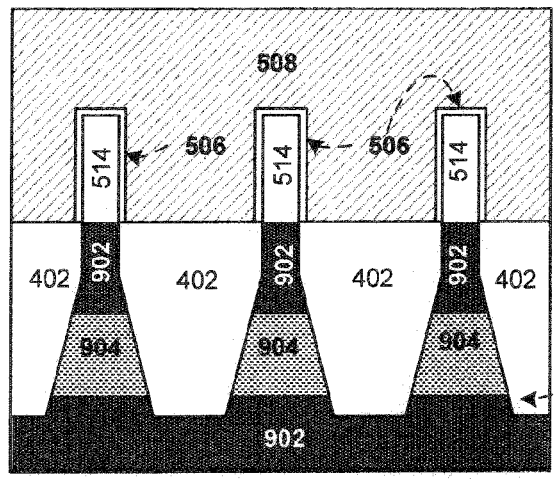
FIG. 9 shows three cross-sectional views of the second device structure after the fabrication process in accordance with an alternate embodiment of the invention.
Figure 9:
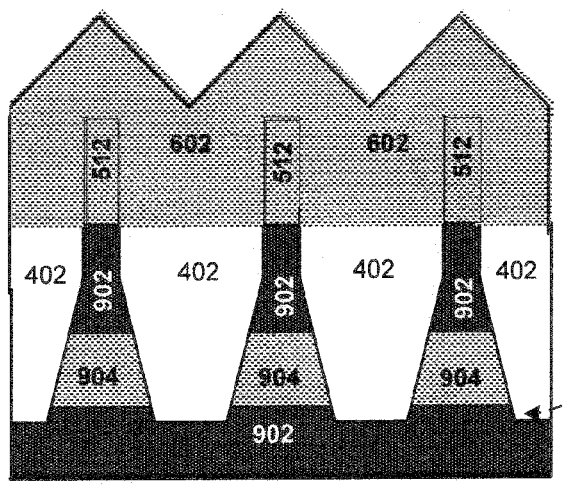
Figure 9:
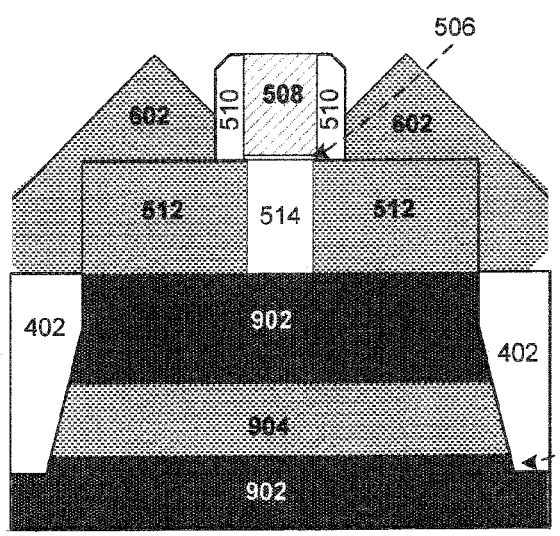

FIG. 9 depicts cross-sectional views of a second device structure along the three cross-sectional planes (A-A', B-B', and C-C') after the fabrication process in accordance with an embodiment of the invention. The fabricated device shown in FIG. 9 provides two p-n junctions for radiation hardening (and noise isolation) between the channel and the base of the vertical fin-shaped structure.

Per block 102, a semiconductor wafer is provided. The semiconductor wafer may be, for example, silicon substrate. The silicon substrate may be un-doped or lightly doped.

Per block 103, a patterned mask for well implantation may be formed. This step may include depositing a mask layer and using lithography to pattern the mask layer to expose regions for well implantation. Well implantation may then be performed per block 104. The well implantation may form either an n-type or a p-type well region, depending on the embodiment. High-energy ion implantation may be used to more heavily dope a buried layer beneath upper layers of the substrate. In one implementation, the well implantation may implant dopant atoms at a density on the order of $10^{17}$ cm$^{-3}$.

Per block 105, a patterned mask for buffer implantation may be formed. This step may include depositing a mask layer and using lithography to pattern the mask layer to expose regions for buffer implantation. Buffer implantation may then be performed per block 106. The buffer implantation may form either a p-type or an n-type buffer layer, depending on the embodiment. In accordance with an embodiment of the invention, the well region and the buffer layer should have opposite doping polarities. The buffer implantation may be graded such that the upper portion of the buffer layer is more lightly doped and the lower portion of the buffer layer is more heavily doped. In one implementation, the buffer implantation may implant dopant atoms at a density on the order of $10^{17}$ cm$^{-3}$.

Per block 107, a patterned hard mask may be formed. This step may include depositing a multiple-layer hard mask and using lithography to pattern the hard mask for trench etching. The hard mask may include, for example, an oxide layer (silicon oxide, for example) below a nitride layer (silicon nitride, for example).

Figure 3:
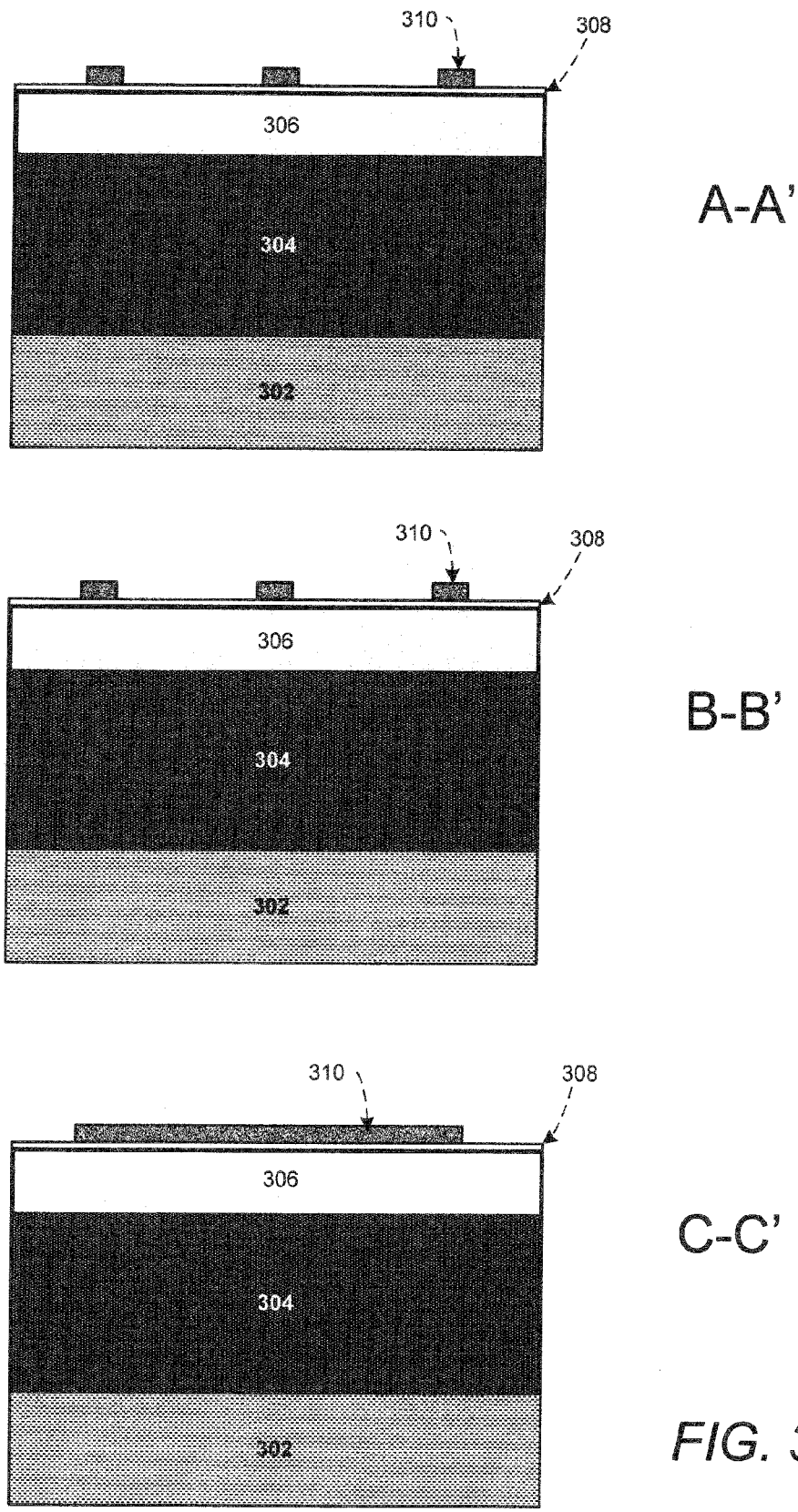
FIG. 3 shows three cross-sectional views of a first device structure after the patterning of resist on a hard mask layer in accordance with an embodiment of the invention.

FIG. 3 provides three cross-sectional views of a first device structure after the patterning of resist on a hard mask layer in accordance with an embodiment of the invention. FIG. 3 depicts an upper semiconductor layer 306, a buffer layer 304 above a well region 302. As mentioned above, the buffer layer 304 and the well region 302 may be doped to be of opposite polarities, and the buffer layer 304 may be implanted so as to have a gradient in the doping profile such that the upper portion of the buffer layer is more lightly doped and the lower portion of the buffer layer is more heavily doped. The upper semiconductor layer 306 may be un-doped or lightly doped. As described further below, the upper semiconductor layer 306 will be used to form the channels, drains, and sources of the finFET device. Further depicted in FIG. 3 is a patterned resist layer 310 to be used for patterning the hard mask 308.

After the hard mask is patterned, a trench etch process may then be performed per block 108 of FIG. 1. The trench etch may be performed using an anisotropic dry etch process. The trench etch may define the vertical fin-shaped structures which are characteristic of the finFET device. Per block 110, a corner rounding process may then be performed. The trenches may then be filled by an oxide fill per block 112. The oxide fill may be performed using a high aspect ratio oxide deposition process. Per block 114, chemical-mechanical planarization (CMP) may be applied to planarize the surface. The hard mask may act as a stop layer for the CMP.

FIG. 4 provides three cross-sectional views of the first device structure after an oxide fill and chemical-mechanical planarization in accordance with an embodiment of the invention. FIG. 4 depicts oxide filled trenches 402 separating the vertical fin-shaped structures 404 formed by un-etched portions beneath the hard mask 308. As depicted, the vertical fin-shaped structures 404 may widen towards its base and may extend below the buffer layer 304 into the well region 302.

Returning to FIG. 1, oxide recess may be performed per block 116. The oxide recess may be a performed, for example, by a dry recess etch process. The oxide recess exposes at least a portion of the upper semiconductor layer of each vertical fin-shaped structure. The exposed portions are fin shaped and may be referred to as the fins-shaped bodies or the fins of the device. A middle part of each fin will be used for the channels of the finFET device, and the side parts of each fin will be used for the sources and drains of the finFET device.

Per block 118, the gate stack may then be formed over the three exposed surfaces of the channels. The gate stack may include a thin gate dielectric layer which is deposited over the three exposed surfaces of fin-shaped channels of the finFET device. The gate dielectric layer may be a gate oxide layer or a high K dielectric layer. The gate stack may further include a gate electrode which is formed over the thin gate oxide layer. The gate electrode may be made of polysilicon, for example, which may be deposited by chemical vapor deposition, or may be a metal gate electrode. Following the gate stack formation, the gate stack spacers may be formed as an oxide layer on either side of the gate electrode per block 120. The gate stack spacers serve to isolate the gate electrode from the sources and drains of the finFET device. Per block 122, source-drain extension (SDE) implantation may then be performed. In one implementation, where the buffer layer is p-type, the SDE implant may dope the drain and source extension regions such that they are n-type. The SDE implantation is an optional step which may be employed in some embodiments. In other embodiments, doping of the sources and drains may be accomplished by way of in situ doping during epitaxial growth of the source and drain.

FIG. 5 provides three cross-sectional views of the first device structure after source-drain extension implantation in accordance with an embodiment of the invention. FIG. 5 shows that the oxide filled trenches 402 have been recessed down to a lower surface level 502 to expose fin-shaped bodies (i.e. fins) 504 of the vertical structures. The exposed fins 504 may include un-doped or lightly-doped channel regions 514 (shown in the A-A' and C-C' cross sections) and doped drain/source regions 512 (shown in the B-B' and C-C' cross sections). The A-A' cross section also shows the gate stack including the thin gate dielectric layer 506 and the gate electrode 508. The gate dielectric 506 is deposited over the three exposed surfaces of the channels 514. The gate stack spacers 510 on the sides of the gate electrode 508 are shown in the C-C' cross section.

Returning to the flowchart of FIG. 1, after the optional SDE implantation, source/drain selective epitaxial growth is performed per block 124. As mentioned above, the epitaxial growth of the source and drain may be accompanied by in situ doping of the source and drain. Deep source/drain implantation may then be performed per block 126. The deep source/drain implantation may be performed to reduce the serial resistance at the sources and drains.

FIG. 6 shows three cross-sectional views of the first device structure after the fabrication process in accordance with an embodiment of the invention. The epitaxial grown portions 602 of the source/drain regions are shown. Note that the actual geometric profile of the epitaxial grown portions 602 may be expected to differ from the simplistic geometry shown in FIG. 6.

In a first implementation of the fabricated device depicted in FIG. 6, the drain and source regions 512 (and extension 602) may be doped n-type, the channel region 514 may be un-doped or lightly-doped, the buffer layer 304 may be doped p-type, and the well region 302 may be doped n-type. In this embodiment, there is a single p-n junction between the p-type buffer layer 304 and the n-type well region 302.

In a second implementation of the fabricated device depicted in FIG. 6, the drain and source regions 512 (and extension 602) may be doped p-type, the channel region 514 may again be un-doped or lightly-doped, the buffer layer 304 may be doped n-type, and the well region 302 may be doped p-type. In this embodiment, there is a single p-n junction between the n-type buffer layer 304 and the p-type well region 302.

Advantageously, the buffer layer 304 effectively hardens the finFET device against charge generated by ionizing radiation. It also advantageously provides noise isolation for the device in that it makes the device less susceptible to electronic noise signals which may otherwise be transmitted up the vertical fin-shaped structure. This is because the buffer layer 304 is of opposite doping polarity compared with the well region 302 such that a p-n junction is formed between the two regions. Due to the p-n junction, the well 302 collects much or most of the charge which would have been collected by the source/drain in a conventional finFET.

Figure 7:
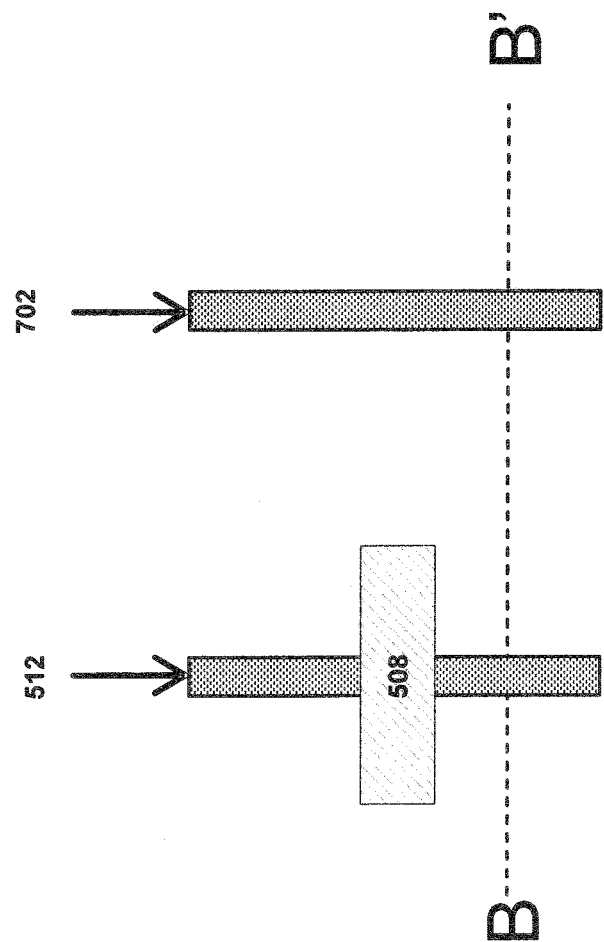
FIG. 7 is a planar view showing select features of a buffered finFET device and a neighboring well tap in accordance with an embodiment of the invention.

FIG. 7 is a planar view showing select features of a buffered finFET device and a neighboring well tap in accordance with an embodiment of the invention. The features (such as the gate electrode 508) depicted in FIG. 7 are actually buried beneath other layers in the final finFET device. A B-B' cross-sectional plane from FIG. 2 is shown in FIG. 7 and cuts across a drain (or source) feature 512 and the neighboring well tap 702.

Figure 8:
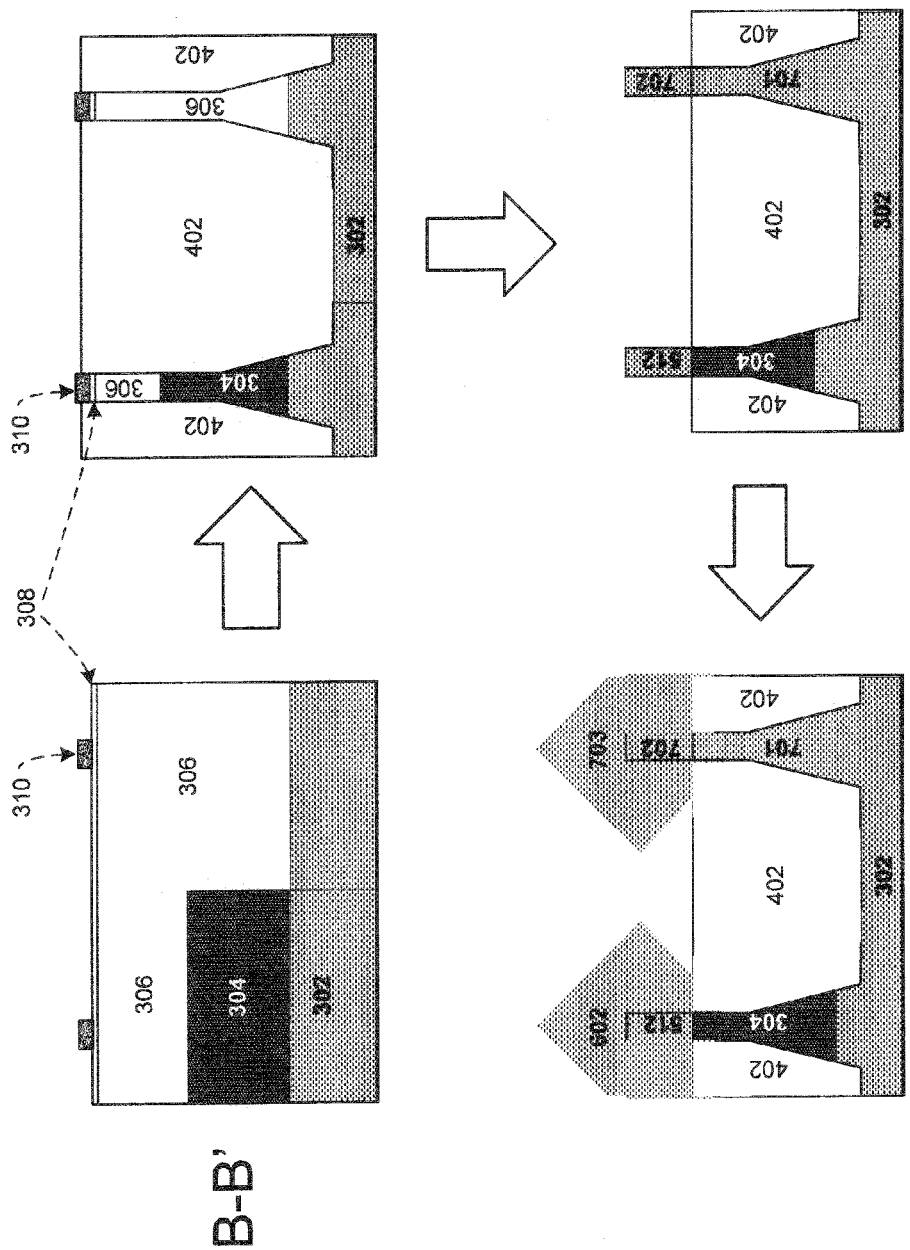
FIG. 8 shows a cross-sectional view after various steps during the fabrication of the buffered finFET device and the neighboring well tap in accordance with an embodiment of the invention.

FIG. 8 shows four cross-sectional views in the B-B' plane of FIG. 7 during the fabrication of the finFET device in accordance with an embodiment of the invention. The cross-sectional views shown correspond to various points in the fabrication process. The drain (or source) feature 512 of the buffered finFET device is being formed on the left side of each view, and the well tap 702 is being formed on the right side of each view.

The first cross-sectional view in the upper left corner of FIG. 8 depicts the cross section after patterning of the resist layer 310 over the hard mask layer 308. This view shows the device at the same point in the fabrication process as FIG. 3. As seen, the buffer layer 304 is formed on the left side for the buffered finFET device, but it is not formed on the right side for the well tap. Instead, the intrinsic or lightly-doped upper semiconductor layer 306 extends from the well region 302 to the hard mask layer 308 for the well tap.

The second cross-sectional view in the upper right corner of FIG. 8 depicts the cross section after CMP of the oxide fill. This view shows the device at the same point in the fabrication process as FIG. 4. As seen, the vertical fin-shaped structure on the right side for the well tap does not have the buffer layer 304. Instead, the upper semiconductor layer 306 extends from the well region 302 at the base of the vertical fin-shaped structure to the hard mask layer 308 for the well tap.

The third cross-sectional view in the lower right corner of FIG. 8 depicts the cross section after the SDE implantation. This view shows the device at the same point in the fabrication process as FIG. 5. At this point, there is an exposed fin-shaped body 512 on the left side for the drain (or source) and an exposed fin-shaped body 702 on the right side for the well tap. While a buffer layer 304 of opposite doping polarity lies beneath the drain (or source), the doped semiconductor layer 701 beneath the well tap is of the same doping polarity as the well tap.

Finally, the fourth cross-sectional view in the lower left corner of FIG. 8 depicts the cross section after selective epitaxial growth and deep source/drain implantation. This view shows the device at the same point in the fabrication process as FIG. 6. Here, epitaxial grown portion 602 on the drain (or source), and the epitaxial grown portion 703 for the well tap are shown.

Advantageously, the well tap structure described above may be used to make an electrical connection to the well underneath the buffered finFET device. The well tap structure shown in FIGS. 6 and 7 has a separate fin 702 for the well connection. Alternatively, the well tap structure may use a separate planar region, instead of a separate fin, for the well connection. The well tap may be used to set an appropriate bias for the well of the finFET device. For example, for an n-channel finFET device, the well may be set to the supply voltage Vcc.

FIG. 9 provides three cross-sectional views after fabrication of a second device structure in accordance with another embodiment of the invention. The second device structure may also be fabricated with the process steps per the method of fabrication 100 described above in relation to FIG. 1. However, the buffer and well implants are at different depth levels (and different polarities) for the second device structure.

To form the second device structure per FIG. 9, the well implant 104 and buffer implant 108 steps are used to form a buffer layer 904 which separates two layers of the well region 902. This may be accomplished by a well implant 104 covering a continuous region and then a buffer implant 108 to form the buffer layer 904 in the middle of the continuous region such that the buffer layer 904 is sandwiched between the two remaining layers of the well region 902.

In a first implementation of the fabricated device depicted in FIG. 9, the drain and source regions 512 (and extension 602) may be doped n-type, the channel region 514 and the well region (layers) 902 may be doped p-type, and the buffer layer 904 may be doped n-type. In this embodiment, two p-n junctions are formed due to the n-type buffer layer 904 being sandwiched in the middle of two layers of the p-type well region 902.

In a second implementation of the fabricated device depicted in FIG. 9, the drain and source regions 512 (and extension 602) may be doped p-type, the channel region 514 and the well region (layers) 902 may be doped n-type, and the buffer layer 904 may be doped p-type. In this embodiment, two p-n junctions are formed due to the p-type buffer layer 904 being sandwiched in the middle of two layers of the n-type well region 902.

Advantageously, the buffer layer 904 effectively hardens the finFET device against charge generated by ionizing radiation It also advantageously provides noise isolation for the device in that it makes the device less susceptible to electronic noise signals which may otherwise be transmitted up the vertical fin-shaped structure. This is because the buffer layer 904 is of opposite doping polarity compared with the two adjacent layers of the well region 902. As such, two p-n junctions are formed between the buffer layer 904 and the two layers of the well region 902. Due to the two p-n junctions, the layer of the well region 902 near the base 406 and the buffer layer 904 collects much or most of the charge which would have been collected by the source/drain in a conventional finFET.

In other embodiments, additional p-n junctions, besides the one or two p-n junction described above, may be created by additional implants or by implants in combination with epitaxial growth. More than two p-n junctions would provide further radiation hardening (and noise isolation), but at the cost of additional process steps.

It is contemplated that the buffered finFET devices disclosed herein may be used to form an SEU-resistant memory cell. It is also contemplated that the buffered finFET devices disclosed herein may be utilized to form noise-resistant analog circuits. The buffered finFET devices disclosed herein may also be used in other electronic circuits. Various types of integrated circuits, including field programmable gate arrays (FPGAs), microprocessors, application specific integrated circuits (ASICs), and so on, may utilize the buffered finFET devices disclosed herein.

Figure 10:
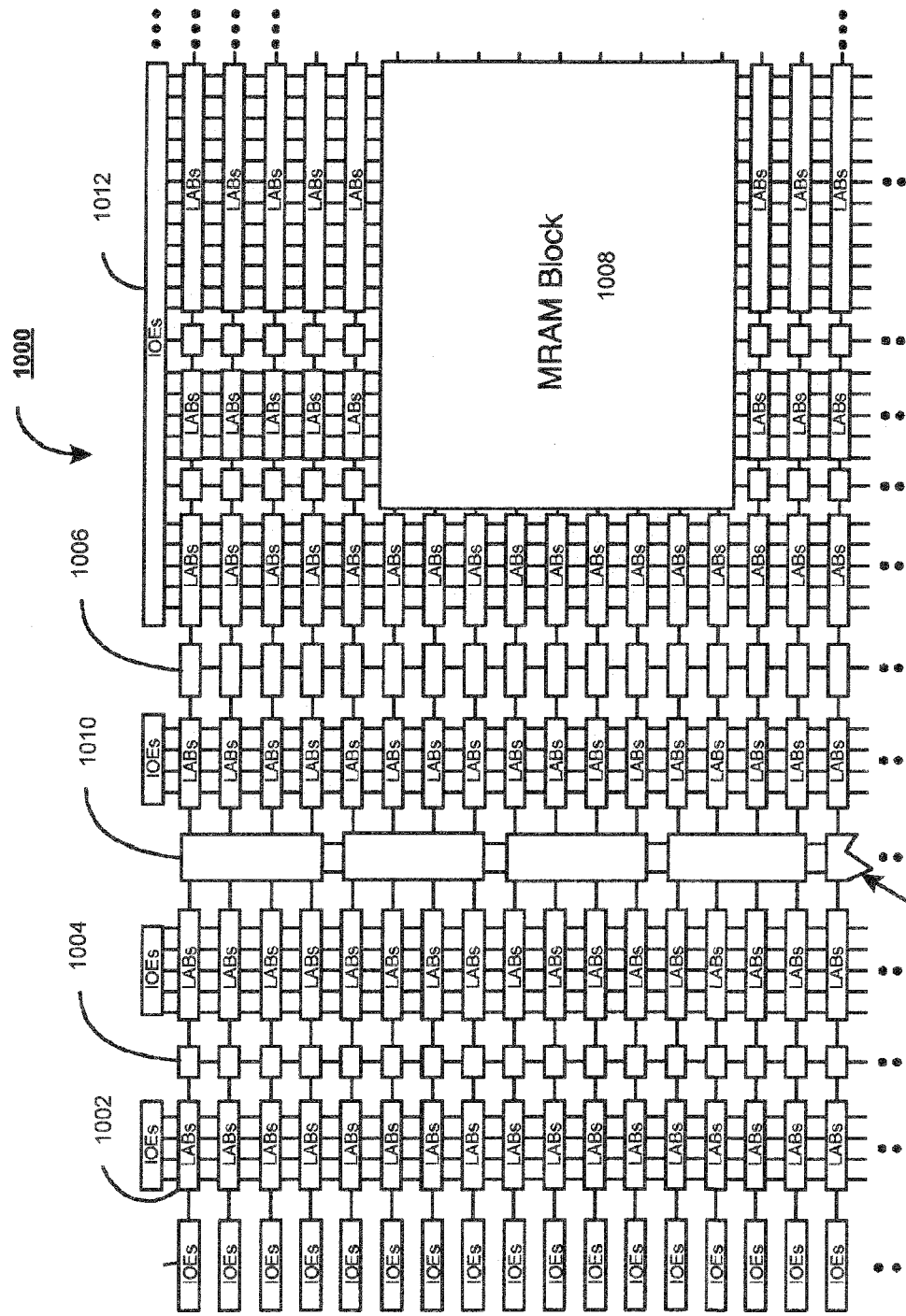
FIG. 10 is a simplified partial block diagram of a field programmable gate array (FPGA) that may be configured to implement an embodiment of the present invention.

FIG. 10 is a simplified partial block diagram of an FPGA 1000 that can include aspects of the present invention. For example, CRAM cells and/or analog circuits in the FPGA 1000 may be formed using the buffered finFET devices described herein. During operation of the FPGA, the CRAM cells store the configuration data which is used to program the FPGA. The analog circuits may be employed, for example, for high-speed serial communication links or for other purposes.

It is to be understood that FPGA 900 is described herein for illustrative purposes only and that the present invention can be implemented in many different types of integrated circuits. In other words, it should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs), microprocessors, and application specific integrated circuits (ASICs).

FPGA 1000 includes within its "core" a two-dimensional array of programmable logic array blocks (or LABs) 1002 that are interconnected by a network of column and row interconnect conductors of varying length and speed. LABs 1002 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 1000 may also include a distributed memory structure including random access memory (RAM) blocks of varying sizes provided throughout the array. The RAM blocks include, for example, blocks 1004, blocks 1006, and block 1008. These memory blocks can also include shift registers and FIFO buffers.

FPGA 1000 may further include digital signal processing (DSP) blocks 1010 that can implement, for example, multipliers with add or subtract features. Input/output elements (IOEs) 1012 located, in this example, around the periphery of the chip support numerous single-ended and differential input/output standards. Each IOE 1012 may be coupled to an external terminal (i.e., a pin) of FPGA 1000.

Note that while the device structures shown in FIGS. 6 and 9 include p-n junctions which cover the entire horizontal cross section of the vertical fin-shaped structures. It is contemplated that other embodiments may form a p-n junction which only partially cover the horizontal cross section of the vertical fin-shaped structure. An example of such an embodiment is depicted in FIG. 11.

Figure 11:
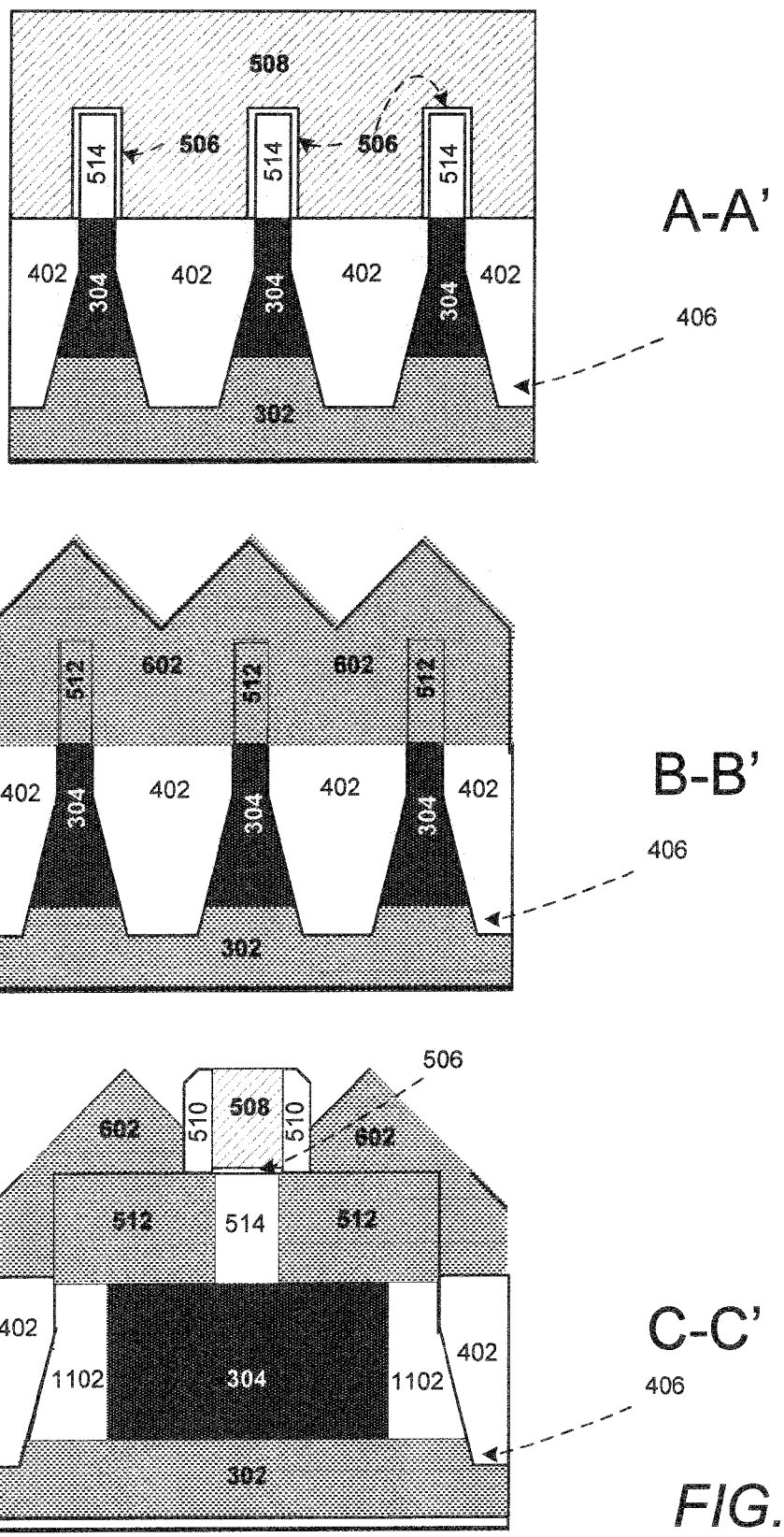
FIG. 11 shows cross-sectional views of a device structure with a p-n junction which only partially spans a horizontal cross section of the vertical fin-shaped structure in accordance with an embodiment of the invention.

The device in FIG. 11 differs from the device in FIG. 6 in that the buffer region 304 in FIG. 11 partially covers the horizontal cross section of the vertical fin-shaped structure. The uncovered portions 1102 of the horizontal cross section may be undoped or lightly doped semiconductor. This is shown in the C-C' cross section.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A transistor device comprising:
a semiconductor substrate;
a buffered vertical fin-shaped structure formed in the semiconductor substrate, the vertical fin-shaped structure including
an upper semiconductor layer including a channel region in between drain and source regions,
a buffer region beneath the upper semiconductor layer, the buffer region having a first doping polarity,
at least part of a well region having a second doping polarity which is opposite to the first doping polarity, and
at least one p-n junction between the buffer region and the well region which at least partially covers a horizontal cross section of the vertical fin-shaped structure; and
a gate stack formed over the channel region of the upper semiconductor layer,
wherein a first layer of the well region is directly above the buffer region, and a second layer of the well region is directly below the buffer region at the base of the buffered vertical fin-shaped structure, such that two p-n junctions are present between the buffer region and the well region.

2. The device of claim 1, further comprising:
oxide-filled trenches adjacent to the vertical fin-shaped structure.

3. The device of claim 2, further comprising:
an epitaxially-grown layer on the source and drain regions.

4. The device of claim 3, further comprising:
gate stack spacers adjacent to the gate stack,
wherein the gate stack spacers electrically isolate a gate electrode of the gate stack from the source and drain regions.

5. The device of claim 1, wherein the buffer region is directly above the well region such that one p-n junction is between the buffer region and the well region.

6. The device of claim 1, further comprising:
a well tap which bypasses the buffered vertical fin-shaped structure and electrically connects to the well region.

7. The device of claim 1, wherein the horizontal cross section of the vertical fin-shaped structure is fully covered by the p-n junction.

8. A method of fabricating a finFET device comprising a buffered vertical fin-shaped structure on a semiconductor substrate, the method comprising:

implanting a well region at least partially within the vertical fin-shaped structure to be a first doping polarity; and implanting a buffer region in the vertical fin-shaped structure to be a second doping polarity which is opposite to the first doping polarity, wherein at least one p-n junction is formed between the buffer region and the well region and at least partially covers a horizontal cross section of the vertical fin-shaped structure, wherein the buffer region is implanted within the well region, such that a first p-n junction is formed between the buffer region and a first layer of the well region, and a second p-n junction is formed between the buffer region and a second layer of the well region.

9. The method of claim 8, further comprising:
performing a trench etch to form trenches defining side surfaces of the vertical fin-shaped structure; and
filling the trenches with oxide.

10. The method of claim 9, wherein the trench etch also forms trenches defining side surfaces of a vertical well-tap structure which bypasses the buffered vertical fin-shaped structure and electrically connects to the well region.

11. The method of claim 9, further comprising:
performing an oxide recess such that the oxide in the trenches is recessed so as to expose an upper semiconductor layer of the vertical fin-shaped structure.

12. The method of claim 11, further comprising:
forming a gate stack over a channel region of the upper semiconductor layer.

13. The method of claim 12, further comprising:
forming gate stack spacers adjacent to the gate stack; and
performing selective epitaxial growth on source and drain regions of the upper semiconductor layer.

14. The method of claim 8, wherein the buffer region is implanted directly above the well region, such that one p-n junction is formed between the buffer region and the well region.

15. The method of claim 8, wherein implants of the well and buffer regions are such that the horizontal cross section of the vertical fin-shaped structure is fully covered by the at least one p-n junction.

16. An integrated circuit comprising at least one buffered finFET device, the buffered finFET device comprising:
a buffered vertical fin-shaped structure which includes at least
an upper semiconductor layer including a channel region in between drain and source regions,
a buffer region beneath the upper semiconductor layer, the buffer region having a first doping polarity,
at least part of a well region having a second doping polarity which is opposite to the first doping polarity, and
at least one p-n junction between the buffer region and the well region which at least partially covers a horizontal cross section of the vertical fin-shaped structure; and
a gate stack formed over the channel region of the upper semiconductor layer,
wherein a first layer of the well region is directly above the buffer region, and a second layer of the well region is directly below the buffer region at the base of the buffered vertical fin-shaped structure, such that two p-n junctions are present between the buffer region and the well region.

17. The integrated circuit of claim 16, further comprising:
a well tap which bypasses the buffered vertical fin-shaped structure and electrically connects to the well region.

18. The integrated circuit of claim 16, wherein the buffered finFET device is part of a static memory cell.

19. The integrated circuit of claim 16, wherein the buffered finFET device is part of an analog circuit.

* * * * *